United States Patent
Hwang

(10) Patent No.: US 6,807,432 B2
(45) Date of Patent: Oct. 19, 2004

(54) WIRELESS TRANSMISSION NETWORK CARD

(76) Inventor: Hong-Wen Hwang, Building B, 16F, No. 102, Sec. 1, Hsin-Tai 5th Rd., Shi-Jih, Taipei (TW)

(*) Notice: Subject to any disclaimer, the term of this patent is extended or adjusted under 35 U.S.C. 154(b) by 548 days.

(21) Appl. No.: 09/924,775

(22) Filed: Aug. 8, 2001

(65) Prior Publication Data

US 2003/0032450 A1 Feb. 13, 2003

(51) Int. Cl.[7] ............................................. H04M 1/00
(52) U.S. Cl. ...................... 455/558; 455/557; 455/90.3; 345/725; 345/970; 345/108; 335/235; 335/38
(58) Field of Search ................................ 455/558, 557, 455/90.3, 559; 345/725, 108, 109, 970; 335/38, 235

(56) References Cited

U.S. PATENT DOCUMENTS 5,373,149 A * 12/1994 Rasmussen ................. 235/492
6,164,531 A * 12/2000 Harris et al. ................ 235/380

* cited by examiner

Primary Examiner—Nay Maung
Assistant Examiner—Shaima Q. Aminzay
(74) Attorney, Agent, or Firm—Clement Cheng

(57) ABSTRACT

A wireless transmission network card frame kit assembly consists of: a lower frame for housing electric circuits or other necessary elements including a first section which is wedged in a computer socket when the network card is inserted in the computer socket, and a second section for housing wireless receiving or emitting modules being exposed outside the computer when the network card is inserted in the computer socket to facilitate wireless transmission; an upper frame having an assembly section located above the second section when assembled and faced the first section; an upper cap covering the first section of the lower frame and having an overlap section to overlap over the assembly section; and a lower cap to encase the bottom side of the first section of the lower frame and the overlap section of the upper frame, and engage tightly with the upper cap at indented grooves of the upper cap.

16 Claims, 2 Drawing Sheets

WIRELESS TRANSMISSION NETWORK CARD

FIELD OF THE INVENTION

The present invention relates to a computer communication peripheral element and particularly a wireless transmission network card.

BACKGROUND OF THE INVENTION

The continuous expansion of information and computer markets has sparked a trend of light weight and slim size and multi-functionality in product design. Many electronic products have been developed and introduced based on these concepts. Presently, a huge amount of efforts have been invested in the development of wireless devices and facilities (such as Bluetooth modules). In order to conform to this trend and to meet the growing demands, many advanced equipment and electronic devices have included built-in wireless communication modules, such as wireless keyboards, wireless mouse and the like. Hence wireless emitting and receiving devices have become increasing important. They are required for signal transmission or receiving either in wireless electric wave or infrared radiation transmission devices.

The general notebook or handheld computers mostly adopt PCMCIA card (Personal Computer Memory Card International Association) specifications. The PCMCIA card usually is inserted into a socket of the computer, and generally includes the function of modem, network communication, etc. Eventually, PCMCIA Modem Cards have become very popular computer peripheral devices for providing remote data receiving or transmission function to notebook computers. To those skilled in the art, modem can transform or decode binary signals to analog signals to facilitate data transmission on the telephone lines.

The reference U.S. Pat. No. 5,397,857 suggests using ultrasonic wave to solder plastic frame surface for bonding two protective caps. Some others propose to adapt laser soldering to achieve fixed fastening. For instance, U.S. Pat. No. 3,586,816 to Hagen suggests to adapt laser focusing and optical multi-point soldering. U.S. Pat. No, 4,833,295 to Locker suggests to use laser or electronic beam soldering.

The development of wireless technology also has spawned a number of patents on wireless transmission cards. For instance, U.S. Pat. No. 5,373,149 to Rasmussen (Assignee: AT&T Bell Laboratories.), titled: "Folding electronic card assembly" discloses a device which couples two boxes of the size of a credit card by a hinge. It has a first portion to contain electric circuits and another portion to contain antenna and radio frequency circuits. It is adaptable for many different types of PCMCIA sockets.

Most techniques disclosed in the prior art use transmission lines for connection. Whereas, the contemporary trend of development is focusing on wireless transmission. Moreover, many currently adapted techniques employ laser soldering to attain fixed bonding. However, during test for conforming to EMI specifications, it happens that a substantial proportion of the products have to dismantle for adjustment. The fixed bonding makes dismantling of the products difficult. The present invention aims to provide improvements for bonding the wireless transmission network cards to overcome the problems incurred to the products that adopt conventional techniques.

SUMMARY OF THE INVENTION

The primary object of the invention is to provide a novel wireless transmission network card frame kit assembly.

The wireless transmission network card according to the invention includes: a lower frame for housing electric circuits or other necessary elements. The lower frame consists of a first section for matching the PC board and the front end 68 PIN Connector, and is inserted and located in the socket of the computer, and a second section which is exposed outside the computer when the network card is inserted in the computer socket for housing wireless receiving or emitting modules for wireless transmission; an upper frame including an assembly section located above the second section when assembling and facing the first section; an upper cap for covering the first section of the lower frame includes an overlap section located at one end thereof to overlap the assembly section of the upper frame; and a lower cap for covering the bottom side of the first section of the lower frame and extending upwards to engage with indented grooves of the upper cap.

The lower frame further has a jut extending outwards from one end of the first section. The jut has a horizontal slot formed at one end of the jut. The second section has apertures to facilitate displaying of light emitting diodes. The first section has an outer rim structure formed at two side edges. The upper cap has two lugs to insert into the horizontal slot of the jut. The lower cap also has tow lugs to insert into the horizontal slot of the jut.

The outer rim structure includes a gutter trough to facilitate assembling. When the upper cap covers the first section of the lower frame, its two sides has downward side flanges to match and couple with the outer rim structure set forth above, and has a slant hook section to engage with the gutter trough of the outer rim structure. The lower cap encases the first section of the lower frame and has two upward side flanges each has a curved hook formed at the front end to snap one side of the indented groove of the upper cap so that the entire structure may be fastened tightly.

The foregoing, as well as additional objects, features and advantages of the invention will be more readily apparent from the following detailed description, which proceeds with reference to the accompanying drawings.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a number of preferred embodiments directed to wireless transmission network card, it is not intended that these illustrations be a limitation on the scope or applicability of the present invention. Further, while the illustrative examples use metal alloy, it should be recognized that the metal alloy portions might be replaced with other metal alloy related portions. Thus, it is not intended that the network card of the present invention be limited to the structures illustrated. This card is included to demonstrate the utility and application of the present invention to presently preferred embodiments.

The present invention aims at providing a wireless transmission network card that has excellent EMI (Electromagnetic Interference) guarding capability and is tightly bonded under normal conditions without the needs of ultrasonic or laser soldering and may be dismantled with a simple tool.

Figure 1:
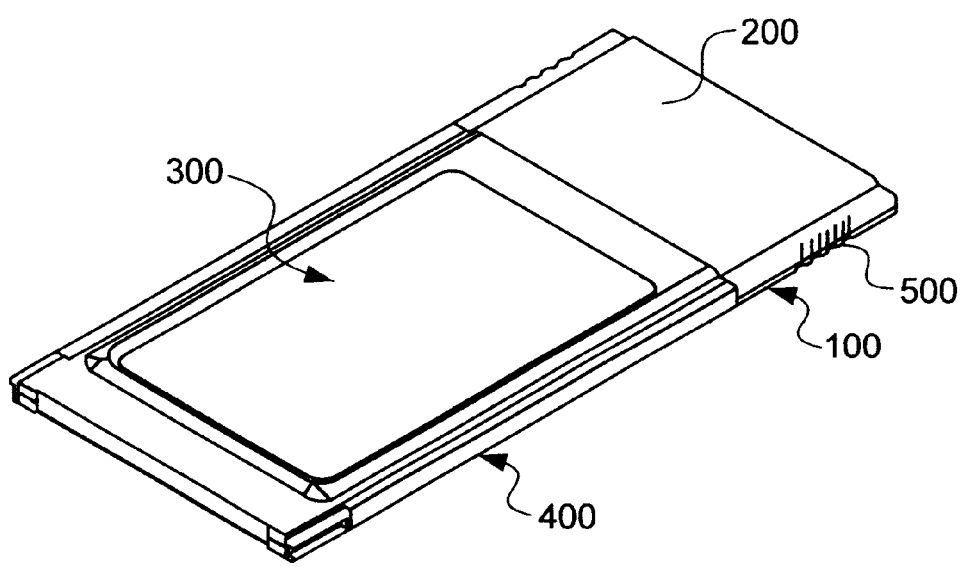
FIG. 1 is a perspective view of the preferred invention.
Figure 2:
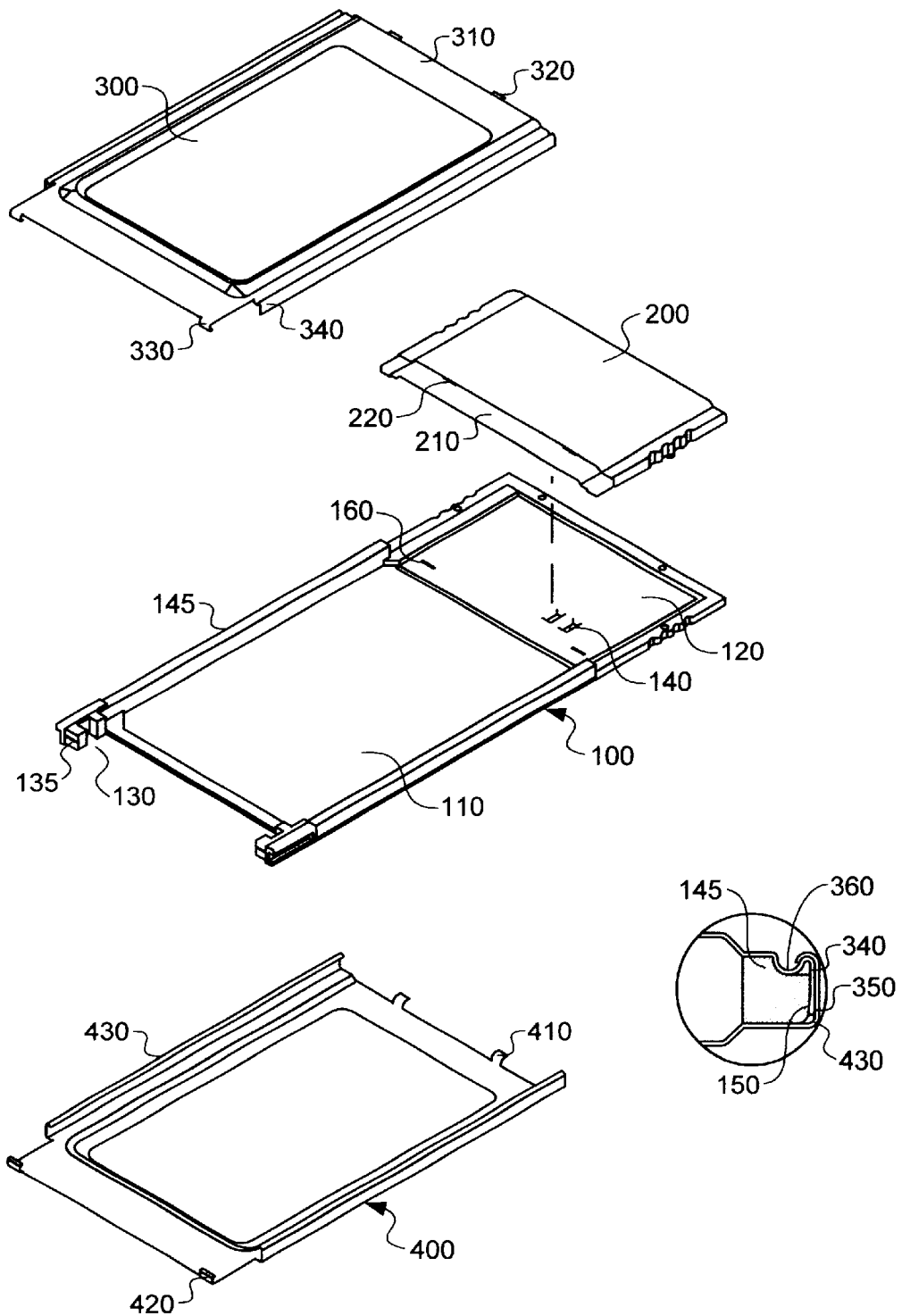
FIG. 2 is an exploded view of the present invention.

Referring to FIGS. 1 and 2, the present invention includes a lower frame 100 made of plastics for housing electric circuits or other necessary elements. The lower frame 100 has a first section 110 for inserting in a socket of a computer and a second section 120 exposing out of the computer socket when the invention is coupled to the computer socket. The second section 120 contains wireless receiving or emitting modules to facilitate wireless transmission. The first section 110 further has a jut 130 extending outwards from one end thereof. The jut 130 has a horizontal slot 135 formed at a rear end thereof. In an embodiment of the invention, the second section 120 has apertures 140 to facilitate displaying of light emitting diodes and two indented slots 160 for receiving and fastening a lower cap 410. Furthermore, the first section 110 has a relatively thick outer rim structure 145 located at two side edges of the first section 110.

The upper frame 200 may also be made of plastics and includes an assembly section 210. When assembled, the upper frame 200 is located above the second section 120 and the assembly section 210 is facing the first section 110. At the inner edge of the assembly section 210, there are two indented wedge slots 220 for receiving and fastening the upper cap 320. The lower frame 100 and upper frame 200 are made of reinforced plastics to enhance the structural sturdiness.

The upper cap 300 may be made of stainless steel with the specification of 0.2 MM SUS 304. When assembled, the upper cap 310 covers the first section 110 of the lower frame 100 and has one end forming an overlap section 310 to lay over the assembly section 210 of the upper frame 200. The overlap section 310 has two lugs 320 extending from the outer rim thereof to engage with the wedge slots 220 of the assembly section 210 during assembling. Another end of the upper cap 310 also has extended lugs 330 to engage with the horizontal slot 135 of the jut 130 of the first section 110 when the upper cap 310 is assembled to the lower frame 100.

The lower cap 400 may also be made of stainless steel with the specification of 0.2 MM SUS 304. When assembled, the lower cap 400 encases the bottom side of the first section 110 of the lower frame 100. The lower cap 400 has one end with two extended lugs 410 to engage with the indented slots 160. Another end of the lower cap 400 also has two extended lugs 420 to engage with the horizontal slot 135 of the jut 130 of the first section 110 of the lower frame 100.

It is to be noted, the outer rim structure 145 of the first section 110 is located at two side edges of the first section 110, and includes a gutter trough 150. When assembled, the upper cap 300 covers the first section 110 of the plastic lower frame 100. The upper cap 300 has two downward side flanges 340 extending downwards at two sides thereof to couple with the outer rim structure 145. Each downward side flange 340 has a hook section 350 to engage with the gutter trough 150 of the outer rim structure 145. The lower cap 400 encases the first section 110 of the lower frame 100 and has two upward side flanges 430 extending upwards at two sides thereof to cover the outer rim structure 145, and couple with indented grooves 360 formed at two sides of the downward side flanges 340.

FIG. 2 shows the finished assembly of the present invention. The lower frame 100 and/or upper frame 200 may have a grip section 500 to facilitate coupling of the wireless transmission network card with the socket, either inserting or removing.

In summary, the present invention has the following advantages:
1. It is assembled tightly and provides excellent EMI guarding effect.
2. It is not bonded by laser soldering and is easy to disassemble for adjustment. It does not destroy the upper cap and lower cap during repairs like conventional techniques.
3. It has exposed plastic upper frame and lower frame, and does not hinder wireless transmission for the wireless transmission modules housed therein.

Therefore, according to the above description, the present invention for a wireless transmission network card will comprise the followings:

There is a first frame 100 for housing electric circuits and necessary elements. Also, the first frame 100 can own a first section which is located in a computer socket when the network card is inserted into the computer socket, and, a second section for housing wireless receiving or emitting modules to facilitate wireless transmission and being exposed outside the computer when the network card is inserted into the computer socket. One of the main parts, there is a second frame 200 having an assembly section, which is located above the second section when assembled and faces the first section. The first section of the first frame 100 is covered by a first cap 300 having an overlap section at one end thereof to overlap over the assembly section of the second frame 200. And, finally, the last part of the preferred embodiment, a second cap 400 encasing the bottom side of the first section of the first frame 100 can be carried out.

While the preferred embodiment of the invention has been set forth for purpose of disclosure, modifications of the disclosed embodiment of the invention as well as other embodiments thereof may occur to those skilled in the art. Accordingly, the appended claims are intended to cover all embodiments that do not depart from the spirit and scope of the invention.

What is claimed is:

1. A wireless transmission network card, comprising:
   a first frame for housing electric circuits and necessary elements, comprising:
      a first section which is located in a computer socket when the network card is inserted into the computer socket; and
      a second section for housing wireless receiving or emitting modules to facilitate wireless transmission and being exposed outside the computer when the network card is inserted into the computer socket;
   a second frame having an assembly section which is located above the second section when assembled and faces the first section;
   a first cap covering the first section of the first frame and having an overlap section at one end thereof to overlap over the assembly section of the second frame; and
   a second cap encasing the bottom side of the first section of the first frame.

2. The wireless transmission network card of claim 1, wherein the first frame further has a jut extending from one end of the first section, the jut having horizontal slots formed at a rear end thereof, the second section having apertures for displaying light emitting diodes, the first section having an outer rim structure located at two side edges of the first section.

3. The wireless transmission network card of claim 2, wherein the first cap has first lugs for engaging with the horizontal slots of the jut.

4. The wireless transmission network card of claim 2, wherein the second cap has second lugs for engaging with the horizontal slots of the jut.

5. The wireless transmission network card of claim 1, wherein the assembly section has two wedge slots located at an inner rim thereof.

6. The wireless transmission network card of claim 5, wherein the first cap has third lugs for inserting into the wedge slots.

7. The wireless transmission network card of claim 5, wherein the first cap owns fourth lugs for inserting into the wedge slots.

8. The wireless transmission network card of claim 1, wherein the outer rim structure includes a gutter trough to facilitate the cap to cover the first section of the first frame during assembling, the first cap having two downward side flanges at two sides thereof to couple with the outer rim structure and a hook section to engage the outer rim structure, the second cap encasing the first section of the first frame and having two upward side flanges to encase the outer rim structure.

9. The wireless transmission network card of claim 8, wherein the upward side flanges couple with indented grooves formed on the downward side flanges.

10. The wireless transmission network card of claim 1, wherein the first frame is made of plastics.

11. The wireless transmission network card of claim 1, wherein the second frame is made of plastics.

12. The wireless transmission network card of claim 1, wherein the first cap is selectively made of metal or alloy.

13. The wireless transmission network card of claim 1, wherein the second cap is selectively made of metal or alloy.

14. A wireless transmission network card, comprising:

A first frame for housing electric circuits having a first section wheich is located in a computer socket when the network card is inserted into the computer socket and a second section to facilitate wireless transmission when the network card is inserted into the computer socket, a second frame having an assembly section which is located above the second section when assembled and faces the first section, a first cap covering the first section of the first frame and having an overlap section at one end thereof to overlap over the assembly section of the second frame, and a second cap encasing the bottom side of the first section of the first frame.

15. A wireless transmission network card, comprising:
a first frame for housing electric circuits and necessary elements, comprising:
a first section which is located in a computer socket when the network card is inserted into the computer socket; and
a second section for housing wireless receiving or emitting modules to facilitate wireless transmission and being exposed outside the computer when the network card is inserted into the computer socket;
wherein the first frame further has a jut extending from one end of the first section, the jut having horizontal slots formed at a rear end thereof, the second section having apertures for displaying light emitting diodes, the first section having an outer rim structure located at two side edge of the first section;
a second frame having an assembly section which is located above the second section when assembled and faces the first section;
a first cap covering the first section of the first frame and having an overlap section at one end thereof to overlap over the assembly section of the second frame, wherein the first cap has first lugs for engaging with the horizontal slots of the jut; and
a second cap encasing the bottom side of the first section of the first frame.

16. A wireless transmission network card, comprising:
a first frame for housing electric circuits and necessary elements, comprising:
a first section which is located in a computer socket when the network card is inserted into the computer socket; and
a second section for housing wireless receiving or emitting modules to facilitate wireless transmission and being exposed outside the computer when the network card is inserted into the computer socket;
a second frame having an assembly section which is located above the second section when assembled and faces the first section, wherein the assembly section has two wedge slots located at an inner rim thereof;
a first cap covering the first section of the first frame and having an overlap section at one end thereof to overlap over the assembly section of the second frame; and
a second cap encasing the bottom side of the first section of the first frame.

* * * * *